March 14, 1967
K. L. ZIEGLER
3,309,528
MONOSTABLE MULTIVIBRATOR EMPLOYING
A SILICON CONTROLLED RECTIFIER
Filed May 1, 1963
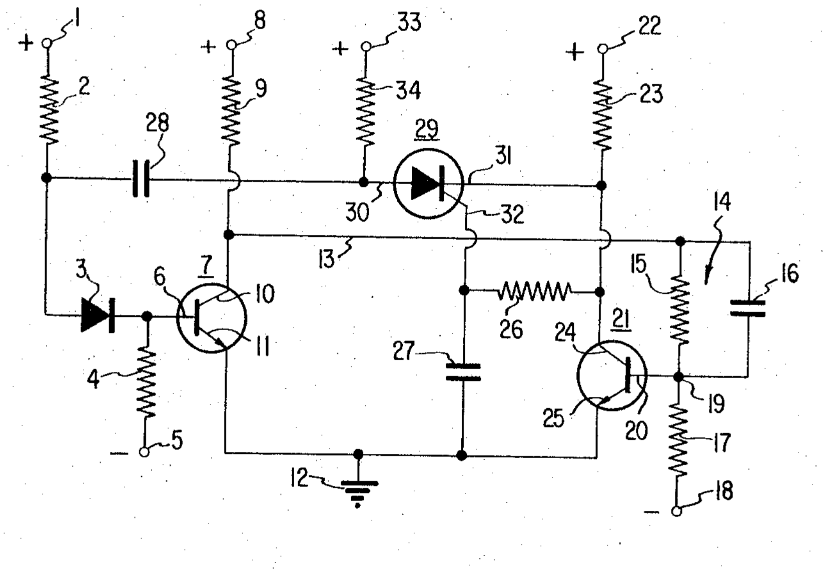
INVENTOR.
KENNETH L. ZIEGLER
BY Herbert W. Arnold
ATTORNEY

United States Patent Office 3,309,528
Patented Mar. 14, 1967

3,309,528

MONOSTABLE MULTIVIBRATOR EMPLOYING A SILICON CONTROLLED RECTIFIER

Kenneth L. Ziegler, Stow, Mass., assignor to Raytheon Company, Lexington, Mass., a corporation of Delaware Filed May 1, 1963, Ser. No. 277,279
10 Claims. (Cl. 307—88.5)

This invention relates to an improved multivibrator circuit, and more particularly to a transistor monostable multivibrator circuit including a an improved timing and control circuit.

In general, multivibrator circuits include at least two amplifying devices so interconnected as to alternately conduct and amplify the applied electrical signal, conduction of one device rendering the other device nonconductive. The various types of multivibrator circuits are classified according to the characteristics of alternate conduction. The various types include astable, monostable, and bistable multivibrator circuits. In an astable circuit, during operation the amplifiers will automatically alternately be rendered conductive without any external electrical control signal being applied. For this reason, astable multivibrator circuits often are called free-running multivibrator circuits. In the stable state of a monostable multivibrator circuit, a first amplifier is conducting and holds a second amplifier in a nonconducting state. Upon application of a proper electrical control signal, the first amplifier is rendered nonconductive and the second amplifier is rendered conductive for a period of time predetermined by the circuitry of the multivibrator, after which period the first amplifier automatically is rendered conductive again, and the second amplifier rendered nonconductive. Thus, when the proper control signal is applied to a monostable multivibrator circuit, the circuit automatically shifts from the stable first state to an unstable second state for a predetermined period of time, and then automatically returns to the stable first state. In one stable state of a bistable multivibrator circuit, a first amplifier is conductive and a second amplifier is nonconductive. Upon application of a proper electrical control signal, the first amplifier is rendered nonconductive and the second amplifier is rendered conductive. In a bistable multivibrator circuit this second state also is stable, and the circuit will remain in this second state until another control signal is applied to shift the circuit back to the first stable state.

Multivibrators often provide pulsed electrical output signals to circuitry requiring such signals. Variations in the impedance of the circuitry utilizing the multivibrator output signal would affect the multivibrator circuitry and result in corresponding variations in the characteristics of the output signal. Since it is desired to have a uniform output signal, regardless of the impedance of the associated circuitry, various multivibrator circuits have been been devised to isolate and otherwise compensate for variations in the impedance of the associated circuitry.

Often the multivibrator circuitry includes a reactance element, such as a capacitor, connected between the amplifying devices. The reactance element is charged during conduction of one of the amplifying devices, and discharged during conduction of a second amplifying device to control the characteristics of the output pulse, particularly to time the duration of conduction of the second amplifying device and thus time the length of the output pulse. When transistors are used as the amplifying devices of a multivibrator, since a transistor will only tolerate a low voltage, it is only possible to apply a low voltage to the circuit, and the capacitor will have a correspondingly low charge on it. This results in a circuit highly sensitive to variations in the amplifying device parameters, particularly the voltage for changing the non-conducting amplifying device to the conducting amplifying device at the end of a timing cycle. Also, this results in a low rate of voltage change on the capacitor at the end of the time interval of conduction of one transistor, especially for circuits designed to provide relatively long output pulses, and concomitantly an appreciable variation in the duration of the output pulses, or output pulse widths. For these reasons, transistor multivibrator circuits are not well suited to applications which require long output pulses with a small variation or tolerance in output pulse width.

This invention contemplates a multivibrator circuit in which both the impedance of the associated circuitry is effectively isolated from the multivibrator circuitry, and the applied reactance element charging voltage is effectively isolated from the transistors. Thus, it is possible to employ a much higher voltage to charge the reactance element, which results in a higher rate of voltage change at the end of the time interval and a more accurate output pulse width that is relatively insensitive to variations in the impedance of the associated circuitry.

The transistor multivibrator circuit generally comprises at least a first and a second amplifier each having at least a control element and an output element, means interconnecting said amplifiers to render each of said amplifiers nonconductive when the other amplifier is conductive, said means including a reactance element connected to the control element of the first amplifier, said means also including a gated uniconductive element having two main electrodes and a gate electrode, said main electrodes connecting said reactance element in series to the output element of the second amplifier, means connected to the gate electrode of the uniconductive element to render the uniconductive element conductive when the second amplifier is conducting, and means for electrically connecting a source of charging voltage to the reactance element between the reactance element and the unconducting device.

The invention will be further described with reference to the accompanying single figure of drawing which schematically illustrates a transistor monostable multivibrator circuit. It will be understood by those skilled in this art that the invention also may be incorporated in other types of multivibrator circuitry.

In the stable state of the illustrated transistor monostable multivibrator circuit, current flows from a source of positive potential 1 through a resistor 2, a diode 3 forwardly biased by the positive potential, and a resistor 4 to a source of negative potential 5, producing a voltage drop across each of these elements. The magnitude of potentials and resistances is so correlated as to produce a small positive potential at the junction between diode 3 and resistor 4. The base electrode 6 of an NPN transistor 7 is connected to the junction between diode 3 and resistor 4, and the small positive potential at this junction biases transistor 7 to conduction. A source of positive potential 8 is applied through resistor 9 to the collector 10 of transistor 7. The emitter 11 of the transistor is connected to a common source of reference potential 12 for the circuit, which may be ground. The positive potential 8 applied to transistor 7 and the positive biasing potential applied to the base of the transistor causes it to conduct. During conduction, current flows from the source of potential 8 through resistor 9, collector 10 and emitter 11 to ground 12, producing a voltage drop across these elements. Since, during conduction, the collector to emitter resistance of a transistor is quite low, most of the voltage drop appears across resistor 9, and collector 10 is at a potential only slightly higher than ground potential 12.

Collector 10 is connected by conductor 13 to a parallel resistor-capacitor circuit 14 comprising resistor 15 and capacitor 16. This circuit 14 is connected in series with resistor 17 to a source of negative potential 18. Negative potential 18 is chosen relative to the potential appearing at collector 10 during conduction of the transistor so that, in this state, the current flowing through the series connected resistors 15 and 17 produces a small negative potential at the junction 19 between these two resistors.

The base collector 20 of an NPN transistor 21 is connected to junction 19. A source of positive potential 22 is applied through resistor 23 to collector 24 of transistor 21. The emitter 25 of transistor 21 is connected to the common source of reference potential 12. Thus, the transistor circuit may be termed a common emitter circuit, since the emitters of transistors 7 and 21 are connected directly to one another.

During conduction of transistor 7, the small negative potential at junction 19 applied to the base of transistor 21 biases the transistor to a state of nonconduction. In this state, the resistance between collector 24 and emitter 25 of transistor 21 is quite high, and a large proportion of potential 22 appears thereacross. A resistor 26 is connected to collector 24 and in series with a capacitor 27 to ground. Thus, during the stable state of the circuit, when transistor 7 is conductive and transistor 21 is nonconductive, potential 22 appearing between the collector 24 and ground causes a current flow through resistor 26 to capacitor 27, charging the capacitor to a value approximating potential 22.

A capacitive reactance element 28 is connected to the junction between resistor 2 and diode 3. A gated uniconductive device 29, preferably a silicon controlled rectifier (SCR), includes two main electrodes, an anode 30 and a cathode 31, and a gate electrode 32. While silicon controlled rectifiers are well known, briefly, they are simply a gated rectifier in which the anode to cathode circuit of the rectifier is virtually an open circuit for normal values of forwardly biasing voltage applied between the anode and cathode, which would normally cause conduction of the rectifier. When a small voltage is applied to the gate of the rectifier, the anode to cathode resistance drops to a very low value and permits current to flow from the anode to the cathode. When the current flow stops, or the anode to cathode circuit of the rectifier is back-biased, the silicon controlled rectifier returns to its open circuit condition. A thyratron is another type of gated uniconductive device. The main electrodes 30 and 31 of the SCR 29 connect the capacitor 28 to collector 24 of the transistor 21, the anode 30 being connected to the capacitor 28 and the cathode 31 being connected to the collector 24. The gate electrode 32 is connected to the junction between resistor 26 and capacitor 27. A source of charging potential 33 for capacitor 28 is electrically connected through resistor 34 to the junction between the anode 30 of the SCR 29 and the capacitor 28.

During the stable state of the circuit, the voltage appearing between resistor 2 and diode 3, which voltage is substantially the same as that applied to base 6 of transistor 7 since current is flowing through the diode 3 and the diode in this state approximates a short circuit, is substantially lower than charging potential 33, and capacitor 28 thus will be charged during the stable state of the circuit to a voltage closely approximating the voltage of potential 33. While potential 33 biases SCR 29 in a direction causing it to conduct, since no gate voltage has been applied to gate 32 of the SCR, the SCR will be in its open circuit condition and no current will flow from anode 30 to cathode 31 of the SCR.

A control signal to switch the transistor monostable multivibrator circuit from its stable state to its unstable state may be applied at various places in the circuit. For example, a negative pulse may be applied across resistor 4 to momentarily bias base 6 of transistor 7 negative, momentarily throwing the transistor to a nonconductive state. Since in this nonconductive state the resistance between collector 10 and emitter 11 of transistor 7 approximates an open circuit resistance, the potential at collector 10 approaches potential 8. This suddenly increased potential is applied through conductor 13 to the series connected resistors 15 and 17 causing the potential at junction 19 to rise to a positive value biasing transistor 21 to conduction. Capacitor 16 increases the rate of rise of this potential. During conduction of transistor 21 the resistance between collector 24 and emitter 25 drops to a low value, the potential at collector 24 approaching ground potential. This permits capacitor 27 to discharge through resistor 26 and the collector to emitter circuit of transistor 21. The current flow through resistor 26 produces a voltage at gate 32 of SCR 29 positive relative to the lower voltage appearing at collector 24 and applied to cathode 31 of the SCR. This voltage difference across resistor 26 gates SCR 29 to its short circuit condition, causing it to conduct. Conduction of SCR 29 lowers the anode 30 of SCR 29 to a potential approaching ground, producing a negative voltage at the junction between resistor 2 and diode 3, which negative voltage back-biases diode 3, holding it in a nonconducting state. Thus, negative potential 5 is applied to base 6 of transistor 7 and continues to hold transistor 7 in a nonconducting state after the momentarily applied control signal ceases, and as capacitor 28 discharges through resistor 2. After capacitor 28 has discharged to a value sufficiently low to cease to back-bias diode 3, current flows through diode 3 and produces a positive voltage at the base 6 of transistor 7, and transistor 7 then again conducts. Conduction of transistor 7 drops the voltage at collector 10 to a low value, which results in a negative voltage at junction 19 that is applied to base 20 of transistor 21, biasing transistor 21 to a state of nonconduction. When the collector 24 of transistor 21 rises, SCR 29 is reversed biased, for capacitor 28 has discharged to approximately zero volts. Thus SCR 29 will return to its high impedance state. Capacitor 27 is also discharged to approximately zero volts and therefore will not retrigger SCR 29. Thus, when capacitor 28 has discharged to a value sufficiently low to permit conduction of diode 3 and produce a positive voltage at base 6 of transistor 7, the multivibrator circuit automatically returns from its unstable state to its stable state. The discharge of capacitor 28, and thus the time constant of the circuit, is determined mainly by resistor 2. The recovery time constant is determined by capacitor 28 and resistor 34.

While transistors normally will not tolerate a voltage of a value substantially greater than 100 volts, charging potential 33 may be of a value substantially greater than this, for example, 300 volts. This is possible since potential 33 and potential 1, which is also high so resistor 2 can be as large as possible, are not applied directly to either transistor, but rather to transistor 7 through resistor 2, diode 3, and capacitor 28 which will isolate transistor 7 from potential 33 or potential 1, and to transistor 21 through SCR 29 which also will withstand a relatively high voltage and thus isolate transistor 21 from potential 33. Also, by employing a charging potential 33 and potential 1 the same, long term (relative to the timing interval) variations of this potential will not effect the timing interval. The timing interval is also independent of potentials 8 and 22.

The output signal may be obtained across resistor 23, and will be pulsed each time a control signal is applied to the circuit. Since variations in impedance of the circuitry to which the output signal is applied effectively are isolated from capacitor 28 by SCR 29, particularly during discharge of the capacitor, any variation in the impedance of the output circuitry will not affect the discharge rate of the capacitor, and thus the output pulse width is not affected by variations in the impedance of the output circuitry. Since potential 33 may have a high value, capacitor 28 may be charged to a high value during the stable state of the circuit. This results in a substantially greater rate of voltage change across capacitor 28, particularly at the end of the timing interval, and affords longer timing intervals, producing output pulses with high accuracy and uniformity, particularly in output pulse widths. Also, because capacitor 28, while it is being charged, is isolated by the SCR from the output circuitry, the capacitor will quickly recover its charge, and the recovery time constant will not be affected by variations in impedance of the output circuitry.

While the invention has been described with respect to NPN transistors and a monostable multivibrator circuit, it will be understood by those skilled in the art that PNP transistors and astable multivibrator circuits may be used with the improved timing and control circuit after appropriate changes in the circuit and potentials. Furthermore, other amplifying devices, particularly those not tolerant of high applied voltages, may advantageously be used in place of the transistors to obtain a monostable or astable multivibrator in which both the impedance of the associated circuitry is effectively isolated from the multivibrator circuitry, and the applied reactance element high charging voltage is effectively isolated from the low voltage amplifying devices. In short, it is to be understood that various changes within the skill of the art may be made in the details of the multivibrator circuit herein described without departing from the invention or sacrificing any of the advantages thereof, the scope of the invention being set forth in the appended claims.

I claim:

1. A multivibrator circuit comprising at least a first and a second amplifier, each amplifier having at least a control element and an output element, means interconnecting said amplifiers to render each of said amplifiers nonconductive when the other amplifier is conductive, said means including a reactance element connected to the control element of the first amplifier and a gated uniconductive element having two main electrodes and a gate electrode, said uniconductive element being a silicon controlled rectifier, said main electrodes connecting said reactance element in series to the output element of the second amplifier, means connected to the gate of the uniconductive element to render the uniconductive element conductive when the second amplifier is conductive, and means for connecting a source of charging voltage for the reactance element between the reactance element and the uniconductive device.

2. A multivibrator circuit as set forth in claim 1, in which said means to render the uniconductive element conductive includes a resistor connected to the junction between the main electrodes of the uniconductive element and the output element of the second amplifier, a capacitor connected in series with said resistor and to a source of reference potential, the gate electrodes of the gated uniconductive element being connected to the junction between the resistor and the capacitor.

3. A multivibrator circuit as set forth in claim 1, in which the reactance element is a capacitor.

4. A multivibrator circuit as set forth in claim 3, in which the amplifiers are devices capable of withstanding a maximum voltage substantially less than the charging voltage for the reactance element.

5. A multivibrator circuit comprising at least a first and a second amplifier, each amplifier having at least a control element and an output element, means interconnecting said amplifiers to render each of said amplifiers nonconductive when the other amplifier is conductive, said means including a reactance element connected to the control element of the first amplifier and a gated uniconductive element having two main electrodes and a gate electrode, said main electrodes connecting said reactance element in series to the output element of the second amplifier, means connected to the gate of the uniconductive element to render the uniconductive element conductive when the second amplifier is conductive, and means for connecting a source of charging voltage for the reactance element between the reactance element and the uniconductive device, said reactance element being a capacitor, said uniconductive element being a silicon controlled rectifier, said amplifiers being transistors, the base of the first transistor being connected in series with the capacitor and the main electrodes of the gated uniconductive element to the collector-emitter output circuit of the second transistor.

6. A multivibrator circuit comprising at least a first and a second amplifier, each amplifier having at least a control element and an output element, means interconnecting said amplifiers to render each of said amplifiers nonconductive when the other amplifier is conductive, said means including a reactance element connected to the control element of the first amplifier and a gated uniconductive element having two main electrodes and a gate electrode, said main electrodes connecting said reactance element in series to the output element of the second amplifier, means connected to the gate of the uniconductive element to render the uniconductive element conductive when the second amplifier is conductive, means for connecting a source of charging voltage for the reactance element between the reactance element and the uniconductive device, said reactance element being a capacitor, said amplifiers being transistors, the base of the first transistor being connected in series with the capacitor and the main electrodes of the gated uniconductive element to the collector-emitter output circuit of the second transistor, said gated uniconductive element being a silicon controlled rectifier, the anode to cathode circuit of the rectifier being connected between the capacitor and the collector-emitter circuit of the second transistor, and in which said means to render the uniconductive element conductive includes a resistor connected to the junction between the silicon controlled rectifier and the second transistor, with a second capacitor connected in series with said resistor and to a source of reference potential, the gate electrode of the silicon controlled rectifier being connected to the junction between the resistor and the second capacitor.

7. A multivibrator circuit comprising at least a first and a second amplifier, each amplifier having at least a control element and an output element, means interconnecting said amplifiers to render each of said amplifiers nonconductive when the other amplifier is conductive, said means including a reactance element connected to the control element of the first amplifier and a gated uniconductive element having two main electrodes and a gate electrode, said main electrodes connecting said reactance element in series to the output element of the second amplifier, means connected to the gate of the uniconductive element to render the uniconductive element conductive when the second amplifier is conductive, means for connecting a source of charging voltage for the reactance element between the reactance element and the uniconductive device, said reactance element being a capacitor, said amplifiers being transistors, the base of the first transistor being connected in series with the capacitor and the main electrodes of the gated uniconductive element to the collector-emitter output circuit of the second transistor, said gated uniconductive element being a silicon controlled rectifier, the anode to cathode circuit of the rectifier being connected between the capacitor and the collector-emitter circuit of the second transistor, and in which said means to render the uniconductive element conductive includes a resistor connected to the junction between the silicon controlled rectifier and the second transistor, with a second capacitor connected in series with said resistor and to a source of reference potential, the gate electrode of the silicon controlled rectifier being connected to the junction between the resistor and the second capacitor, and the connection from the capacitor to the base of the first transistor including a diode connected to permit current flow only from the capacitor to the base.

8. A multivibrator circuit comprising at least a first and a second amplifier, each amplifier having at least a control element and an output element, means interconnecting said amplifiers to render each of said amplifiers nonconductive when the other amplifier is conductive, said means including a reactance element connected to the control element of the first amplifier and a gated uniconductive element having two main electrodes and a gate electrode, said uniconductive element being a silicon controlled rectifier, said main electrodes connecting said reactance element in series to the output element of the second amplifier, means connected to the gate of the uniconductive element to render the uniconductive element conductive when the second amplifier is conductive, means for connecting a source of charging voltage for the reactance element between the reactance element and the uniconductive device, said latter means permitting charging of said reactance element substantially independently of each of said amplifiers.

9. A multivibrator circuit comprising at least a first and a second amplifier, each amplifier having at least a control element and an output element, means interconnecting said amplifiers to render each of said amplifiers nonconductive when the other amplifier is conductive, said means including a reactance element connected to the control element of the first amplifier and a gated uniconductive element having two main electrodes and a gate electrode, said uniconductive element being a silicon controlled rectifier, said main electrodes connecting said reactance element in series to the output element of the second amplifier, means connected to the gate of the uniconductive element to render the uniconductive element conductive when the second amplifier is conductive, means for connecting a source of charging voltage for the reactance element between the reactance element and the uniconductive device, said latter means including means for isolating the charging voltage from said amplifiers.

10. A multivibrator circuit comprising at least a first and second amplifier, each amplifier having at least a control element and an output element, means interconnecting said amplifiers to render each of said amplifiers nonconductive when the other amplifier is conductive, said means including a reactance element connected at one end to the first amplifier and a gated uniconductive element having two main electrodes and a gate electrode, said uniconductive element being a silicon controlled rectifier, said main electrodes connecting the other end of said reactance element in series to the second amplifier, means connected to the gate of the uniconductive element to render the uniconductive element conductive when the second amplifier is conductive, and circuit means for applying a charging voltage to said reactance element in a manner substantially to isolate said voltage from each of said amplifiers.

References Cited by the Examiner

UNITED STATES PATENTS

| | | | |
|---|---|---|---|
| 2,987,632 | 6/1961 | Milford | 307—88.5 |
| 3,067,342 | 12/1962 | Waller | 307—88.5 |
| 3,191,069 | 6/1965 | Sampson | 307—88.5 |

References Cited by the Applicant

UNITED STATES PATENTS

| | | |
|---|---|---|
| 2,721,937 | 10/1955 | Braga. |
| 2,778,935 | 1/1957 | Ropiequet. |
| 2,827,574 | 3/1958 | Schneider. |
| 2,976,432 | 3/1961 | Geckle. |
| 2,991,375 | 7/1961 | Abraham. |
| 2,997,665 | 8/1961 | Sylvan. |
| 3,008,088 | 11/1961 | Beeler. |
| 3,025,417 | 3/1962 | Campbell. |
| 3,040,194 | 6/1962 | Jones. |
| 3,040,270 | 6/1962 | Gutzwiller. |

ARTHUR GAUSS, *Primary Examiner.*

S. D. MILLER, *Assistant Examiner.*